United States Patent
Khang et al.

(10) Patent No.: US 8,049,202 B2
(45) Date of Patent: Nov. 1, 2011

(54) PHASE CHANGE MEMORY DEVICE HAVING PHASE CHANGE MATERIAL LAYER CONTAINING PHASE CHANGE NANO PARTICLES

(75) Inventors: Yoon-Ho Khang, Yongin-si (KR); Wil-Liam Jo, Seoul (KR); Dong-Seok Suh, Seoul (KR)

(73) Assignee: Samsung Electronics Co., Ltd., Gyeonngi-do (KR)

( * ) Notice: Subject to any disclaimer, the term of this patent is extended or adjusted under 35 U.S.C. 154(b) by 0 days.

(21) Appl. No.: 12/382,032

(22) Filed: Mar. 6, 2009

(65) Prior Publication Data

US 2009/0278108 A1  Nov. 12, 2009

Related U.S. Application Data

(63) Continuation-in-part of application No. 11/291,976, filed on Dec. 2, 2005, now abandoned.

(30) Foreign Application Priority Data

Dec. 2, 2004 (KR) .......... 10-2004-0100358
Mar. 15, 2005 (KR) .......... 10-2005-0021340

(51) Int. Cl.
    *H01L 47/00* (2006.01)
(52) U.S. Cl. .......... 257/5; 257/3; 257/4; 257/E45.002; 977/943
(58) Field of Classification Search .......... 257/1–5, 257/E45.002; 977/943
See application file for complete search history.

(56) References Cited

U.S. PATENT DOCUMENTS

| | | | |
|---|---|---|---|
| 7,018,863 B2 | 3/2006 | Moore et al. | 438/95 |
| 7,130,214 B2 | 10/2006 | Lee | 365/163 |
| 7,323,708 B2 * | 1/2008 | Lee et al. | 257/3 |

(Continued)

FOREIGN PATENT DOCUMENTS

| | | |
|---|---|---|
| CN | 1547268 | 11/2004 |
| EP | 1 288 930 | 3/2003 |
| JP | 2002-541613 | 12/2002 |
| JP | 2004-311728 | 11/2004 |
| WO | WO 00/62301 | 10/2000 |

OTHER PUBLICATIONS

Chinese Office Action issued Nov. 28, 2008 for counterpart Chinese Patent Application No. 2005101266304.

(Continued)

*Primary Examiner* — Shouxiang Hu
(74) *Attorney, Agent, or Firm* — Harness, Dickey & Pierce, PLC

(57) ABSTRACT

A phase change memory device including a phase change material layer having phase change nano particles and a method of fabricating the same are provided. The phase change memory device may include a first electrode and a second electrode facing each other, a phase change material layer containing phase change nano particles interposed between the first electrode and the second electrode and/or a switching device electrically connected to the first electrode. The phase change material layer may include an insulating material.

8 Claims, 13 Drawing Sheets

U.S. PATENT DOCUMENTS

| | | | |
|---|---|---|---|
| 2004/0052117 A1 | 3/2004 | Jiang | 365/200 |
| 2004/0165422 A1 | 8/2004 | Hideki et al. | 365/163 |
| 2005/0029502 A1 | 2/2005 | Hudgens | 257/4 |
| 2005/0219800 A1 | 10/2005 | Happ et al. | 361/523 |
| 2006/0163553 A1 | 7/2006 | Liang | 257/3 |

OTHER PUBLICATIONS

Office Action dated Jun. 6, 2008 for counterpart Chinese Application No. 200510126630.4 and English translation thereof.

European Search Report dated Aug. 26, 2008 for counterpart European Application No. 0525416.7.4.

H. Horii et al. "A Novel Cell Technology Using N-doped GeSbTe Films for Phase Change RAM," *2003 Symp. On VLSI Tech.*, Kyoto, Japan, pp. 177-178, XP001211741 (Jun. 10-12, 2003).

Office Action Jul. 12, 2011, in corresponding Japanese Patent Application No. 2005-348039.

\* cited by examiner

100°C

200°C

300°C

400°C

500°C

PHASE CHANGE MEMORY DEVICE HAVING PHASE CHANGE MATERIAL LAYER CONTAINING PHASE CHANGE NANO PARTICLES

CROSS-REFERENCE TO RELATED APPLICATIONS

This Continuation-in-Part application claims the benefit of U.S. patent application Ser. No. 11/291,976 under 35 U.S.C. §120, filed on Dec. 2, 2005 now abandoned, in the United States Patent and Trademark Office and claims priority under 35 U.S.C. §119 to Korean Patent Application Nos. 10-2004-0100358, filed on Dec. 2, 2004, and 10-2005-0021340, filed on Mar. 15, 2005, in the Korean Intellectual Property Office (KIPO), the entire contents of all three of which are incorporated herein by reference.

BACKGROUND

1. Field

Example embodiments relate to a phase change memory device and a method of fabricating the same, and more particularly, to a phase change memory device consuming less electric power and/or having improved current-voltage (I-V) characteristics and a method of fabricating the same.

2. Description of the Related Art

Semiconductor memory devices may be classified as volatile memory devices and non-volatile memory devices according to their capability to retain data when a power supply is disconnected. A dynamic random access memory (DRAM) and a static random access memory (SRAM) are examples of a volatile memory device. Such a memory device stores data as a logic 0 or a logic 1 according to a stored electric potential. DRAM may be able to store many electric charges because a DRAM regularly refreshes. Therefore, research has been conducted to increase the surface area of a capacitor electrode of the DRAM. However, increasing a surface area of a capacitor electrode may make it difficult to integrate a DRAM device.

A flash memory device may include a semiconductor substrate, a gate insulation layer, a floating gate, a dielectric film and/or a gate pattern as a control gate stacked on a semiconductor substrate. A flash memory cell may record or erase data by tunneling electrons through the gate insulation layer. To tunnel the electrons, an operating voltage greater than a supply voltage may be required. Accordingly, a booster circuit may be required to provide the operating voltage for recording and/or erasing the flash memory device.

Therefore, research has been conducted to develop a new memory device having a simple structure, high integrity and/or non-volatile characteristics and/or providing a random access scheme. Recently, a phase change memory device has been spotlighted as a next generation memory device. A phase change memory device uses a phase change material. The phase change material becomes amorphous or crystalline according to the amplitude of a supplied current, that is, Joule heating, and has distinct electric conductivity according to whether it is in an amorphous state or a crystalline state.

FIG. 1 is a graph illustrating a method of operating a phase change memory device according to the conventional art. A method of recording and erasing data in a phase change memory cell will be explained with reference to the graph in FIG. 1. In the graph, the horizontal axis represents time and the vertical axis represents the temperature of a phase change material layer.

Referring to FIG. 1, if the phase change material layer is heated to a temperature higher than a melting temperature Tm of the phase change material and then suddenly cooled as shown in a first curve 1, the phase material layer enters an amorphous state. On the other hand, if the phase change material layer is heated to a temperature lower than the melting temperature Tm and higher than a crystallization temperature Tc of the phase change material over a time T2, which is longer than T1 as shown in a second curve 2 of the graph, the heated phase change material layer is annealed and enters a crystalline state. The resistivity of the phase change material layer in the amorphous state is greater than the resistivity of the phase change material layer in the crystalline state. Accordingly, stored data can be discriminated as logic 1 or logic 0 by detecting a current flowing through the phase change material layer in a read mode. Chalcogenide materials are widely used as the phase change material. Among the chalcogenide materials, a compound material layer (GST) containing germanium (Ge), antimony (Sb) and tellurium (Te) is widely used in phase change memory.

FIG. 2 is a cross sectional view of a phase change memory device according to the conventional art. Referring to FIG. 2, the conventional phase change memory device includes a bottom conductive layer 10, a top conductive layer 18, a thin film type of a phase change material layer 16 interposed between the bottom conductive layer 10 and the top conductive layer 18, and/or a contact unit 14 electrically connecting the bottom conductive layer 10 and the phase change material layer 16. The bottom conductive layer 10 and side surfaces of the contact unit 14 may be surrounded by an insulation layer 12. A contacting surface of the contact unit 14 may be electrically coupled to the phase change material layer 16. A transistor 5 may be electrically connected to the bottom conductive layer 10 and a current may be supplied to the bottom conductive layer 10, the top conductive layer 18 and the phase change material layer 16 interposed between the bottom conductive layer 10 and the top conductive layer 18 through the transistor 5. The current supplied to the top conductive layer 18 may flow through the phase change material layer 16, the contact unit 14, the bottom conductive layer 10 and the transistor 5.

In the phase change memory device, if the current flows between the bottom conductive layer 10 and the top conductive layer 18, the current flows to the phase change material layer 16 through the contact unit 14 and the contacting surface 20. According to the Joule heating caused by the current, the phase change material around the contacting surface 20 changes from a crystalline state to an amorphous state. A current required to change the phase change material from the crystalline state depends on the size of the contacting surface 20. That is, the smaller the contacting surface 20 is, the less current that is required to change the phase change material from the crystalline state. However, the configuration of a conventional phase change memory device having a thin film type phase change material is limited when the size of the contacting surface 20 is reduced.

SUMMARY

Example embodiments provide a phase change memory device consuming less power and/or having improved current-voltage characteristics and a method of fabricating the same.

Example embodiments provide a phase change memory device which ensures less current when changed for a crystalline state.

Example embodiments provide a phase change memory device including a phase change material layer containing phase change nano particles.

According to example embodiments, there is provided a phase change memory device including a first electrode and a second electrode facing each other, a phase change material layer containing phase change nano particles contacting each other and pores exist between the nano particles, the phase change material layer interposed between the first electrode and the second electrode, and a switching device electrically connected to the first electrode.

Example embodiments provide a method of fabricating a phase change memory device including a phase change material layer containing phase change nano particles.

According to another example embodiments, there is provided a method of fabricating a phase change memory device, including preparing a switching device, preparing a first electrode electrically connected to the transistor, forming a phase change material layer including phase change nano particles on the first electrode, the phase change nano particles contacting each other such that pores exist between the nano particles, and forming a second electrode on the phase change material layer.

According to example embodiments, there is provided a method of fabricating a phase change material layer, the method including preparing phase change nano particles and forming the phase change material layer including the phase change nano particles on another layer, the phase change nano particles contacting each other with pores existing between the nano particles.

BRIEF DESCRIPTION OF THE DRAWINGS

Example embodiments will be more clearly understood from the following brief description taken in conjunction with the accompanying drawings. FIGS. 1-13B represent non-limiting, example embodiments as described herein.

FIG. 1 is a graph illustrating a conventional method of operating a phase change memory device;

FIG. 2 is a cross sectional view of a phase change memory device according to the conventional art;

FIG. 3 is a cross sectional view of a phase change memory device according to example embodiments;

FIG. 4 is a graph illustrating estimated reset currents of a phase change memory device according to example embodiments and a conventional phase change memory device;

FIG. 7 is a graph of chemical composition ratio of $Ge_2Sb_2Te_5$ nano particles according to the temperature of a thermal process;

FIG. 9 is a cross sectional view of a phase change memory device fabricated according to example embodiments for observing a current-voltage (I-V) characteristics;

FIG. 10 is a graph illustrating voltage and current pulses used for resetting the phase change memory device shown in FIG. 9; and FIG. 11 is a graph of the current-voltage (I-V) characteristics of the phase change memory device shown in FIG. 9.

FIGS. 13A-13B are views showing a method of fabricating a phase change memory device according to example embodiments.

Figure 1:
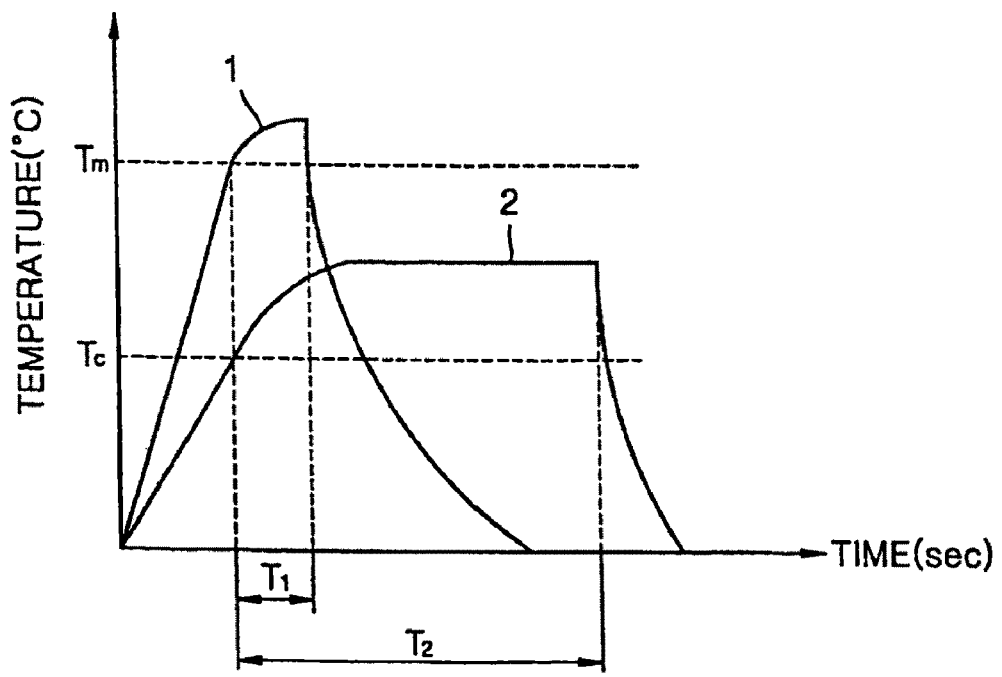
Figure 2:
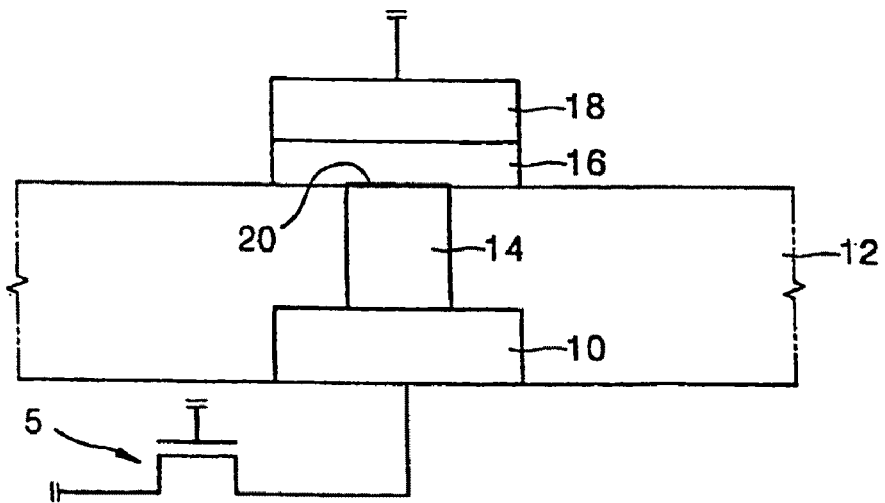

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings in which example embodiments are shown. In the drawings, the thicknesses of layers and regions are exaggerated for clarity.

Example embodiments are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

A phase change memory device according to an embodiment of the present invention may include a first electrode and a second electrode facing each other, a phase change material layer containing phase change nano particles interposed between the first electrode and the second electrode, and a switching device electrically connected to the first electrode. According to example embodiments, the switching device may be a transistor or diode.

According to example embodiments, the phase change material may include a chalcogenide.

For example, the phase change material may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change material may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change material may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change material is described above as being formed primarily of ternary phase-change chalcogenide alloys, the chalcogenide alloy of the phase change material could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_{15}$—$Sb_2$—$S_2$ alloy, for example.

According to example embodiments, the phase change material may be made of a transition metal oxide having multiple resistance states, as described above. For example, the phase change material may be made of at least one material selected from the group consisting of NiO, $TiO_2$, HfO, $Nb_2O_5$, ZnO, $WO_3$, and CoO or GST ($Ge_2Sb_2Te_5$) or PCMO ($Pr_xCa_{1-x}MnO_3$).

The phase change material may be a chemical compound including one or more elements selected from the group consisting of S, Se, Te, As, Sb, Ge, Sn, In and Ag, and a diameter of the nano particles may be in a range of 1 to 100 nm. There may be pores between the nano particles filled with a material, for example, an insulating material, for example, $SiO_2$ or $Si_3N_4$.

A phase change memory device manufacturing method according to example embodiments may include preparing a switching device, preparing a first electrode electrically connected to the switching device, forming a phase change material layer including phase change nano particles on the first electrode, and forming a second electrode on the phase change material layer.

The phase change nano particles may be derived from compound including at least one selected from the group consisting of S, Se, Te, As, Sb, Ge, Sn, In, and Ag. A diameter of the nano particles may be in a range from 1 to 100 nm.

The operation of forming the phase material layer may include preparing phase change nano particles and forming the phase change material layer including the phase change nano particles on the first electrode.

The phase change nano particles may be manufactured using one of the methods selected from the group consisting of laser ablation, sputtering, chemical vapor deposition, precipitation, electro spray, and/or a solution-based method. The phase change nano particles may be manufactured using laser ablation.

After preparing the phase change nano particles, a thermal process may be additionally performed to more uniformly form phase change nano particles. The thermal process may be performed at 100 to 650° C. According to example embodiments, the thermal process may be performed at 200 to 300° C.

The prepared phase change nano particles may be deposited on the first electrode using a thermophoresis method or an electrophoresis method and the phase change nano particles may be deposited as one or more layers.

A desired material, for example an insulating material, may be supplied to fill pores between the phase change nano particles when forming the phase material layer with the phase change nano particles on the first electrode. The insulating material may be $SiO_2$ or $Si_3N_4$.

The phase change nano particles may be doped with nitrogen or silicon to adjust the physical property of the phase change nano particles of the phase change material layer.

Figure 3:
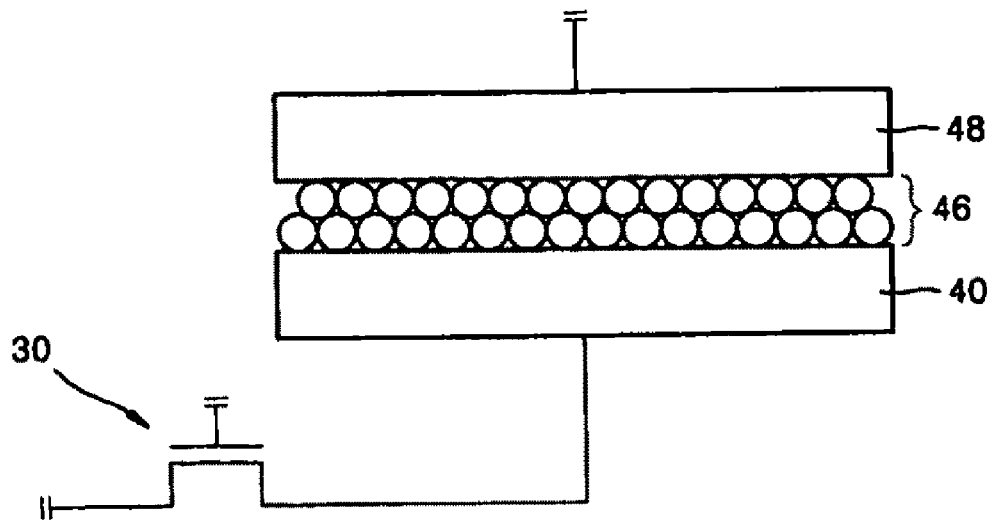

FIG. 3 is a cross-sectional view of phase change memory device according to example embodiments.

Referring to FIG. 3, the phase change memory device may include a first electrode 40 and a second electrode 48 facing each other, a phase change material layer interposed between the first electrode 40 and the second electrode 48, and/or a transistor electrically connected to the first electrode 40. The first electrode 40 and the second electrode 48 may be formed of a conductive material. The phase change memory device may further include a resistive heater having a small contact size on the first electrode 40. The configuration of the first and second electrodes 40 and 48 is well known to those of ordinary skill in the art. Therefore, a detailed explanation thereof is omitted.

If a current flows into the phase change memory device through the transistor 30 or the first electrode 40, the current flows from the first electrode 40 to the second electrode 48 and the state of the phase change material layer 46 interposed between the first electrode 40 and the second electrode 48 is changed according to the amplitude of the current as a result of Joule heating. That is, according to amplitude of the current supplied to the phase change material 46 and the period when the current flows, the phase change material layer 46 may be changed to an amorphous state or a crystalline state, and the phase change material layer 46 may have different electric conductivities according to whether it is in the amorphous state or the crystalline state. The resistivity of the phase change material layer 46 in the amorous state is higher than the resistivity of the phase change material layer 46 in the crystalline state. Accordingly, data stored in the phase change memory device can be discriminated as logic 1 or logic 0 by detecting a current flowing through the phase change material 46 in a read mode.

According to example embodiments, the phase change material layer 46 may contain phase change nano particles. Because the phase change material layer 46 contains phase change nano particles, a current Ireset for changing the phase change material layer 46 from a crystalline state to an amorphous state may be less than the current required in the conventional thin film type of a phase change material, as shown in FIG. 4.

Figure 4:
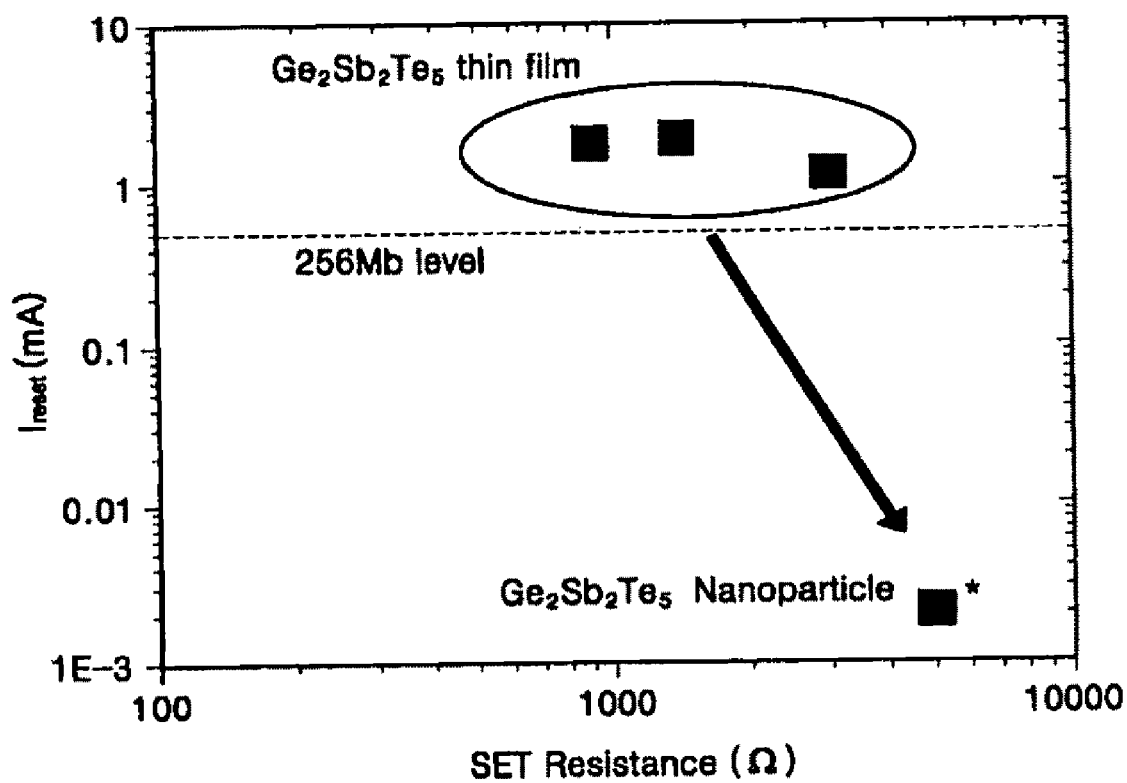
Figure 5A:
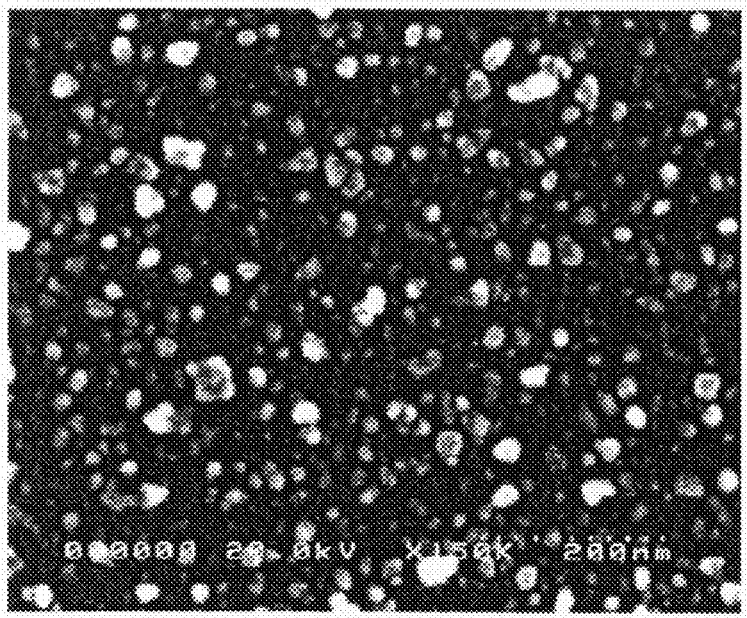
FIGS. 5A-5E are SEM pictures of phase change nano particles which are thermally processed at 100, 200, 300, 400, and 500° C. respectively.
Figure 5B:
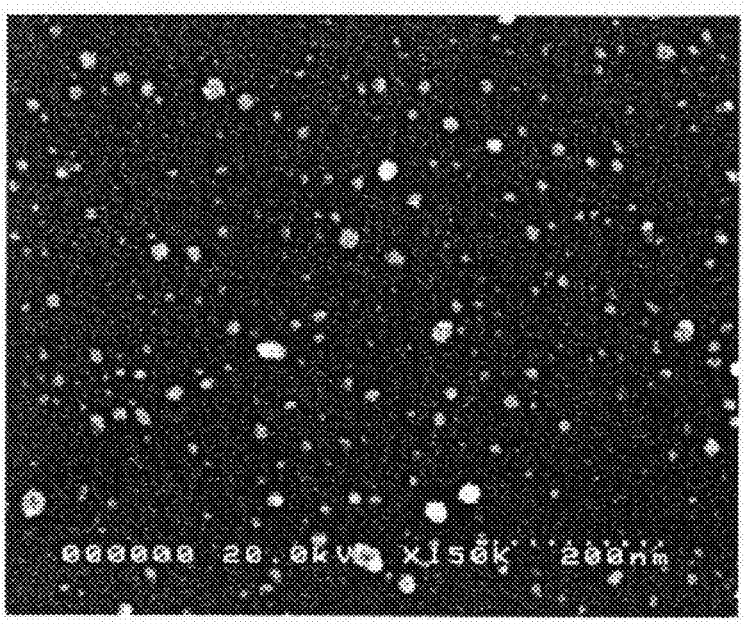
Figure 5C:
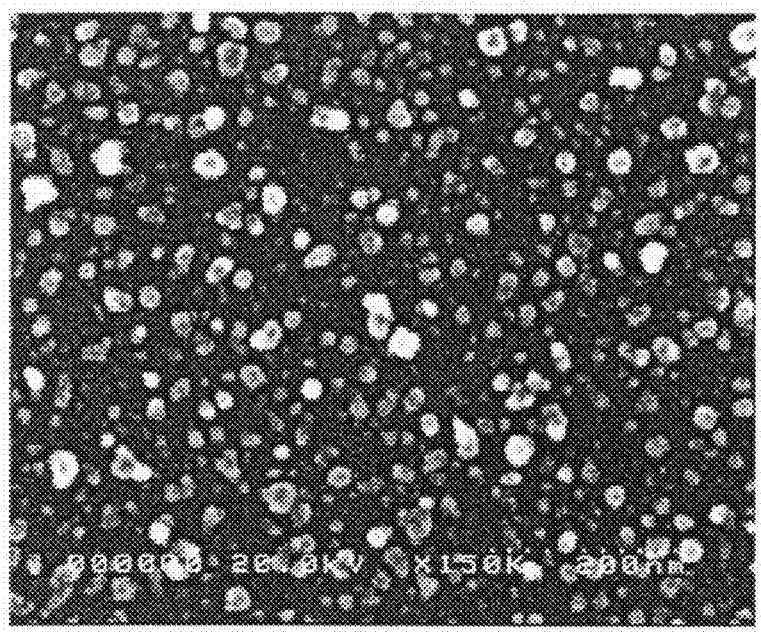
Figure 5D:
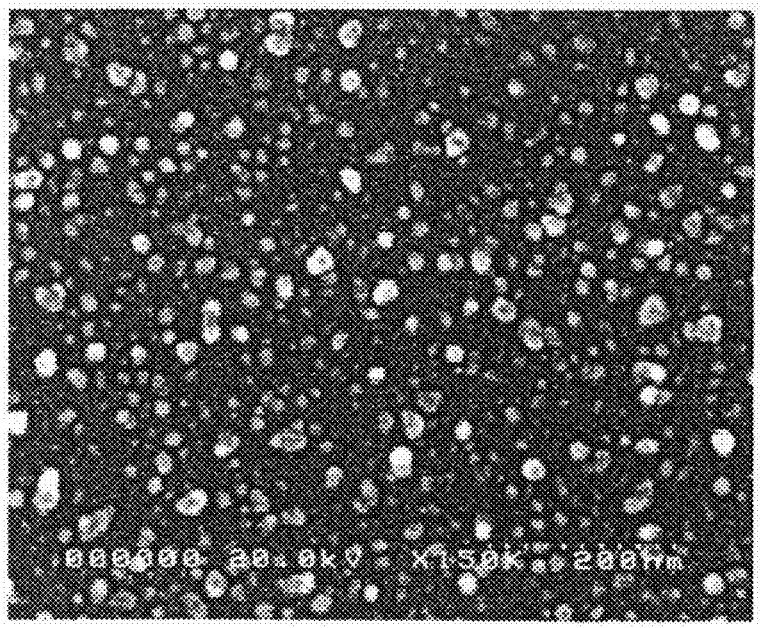
Figure 5E:
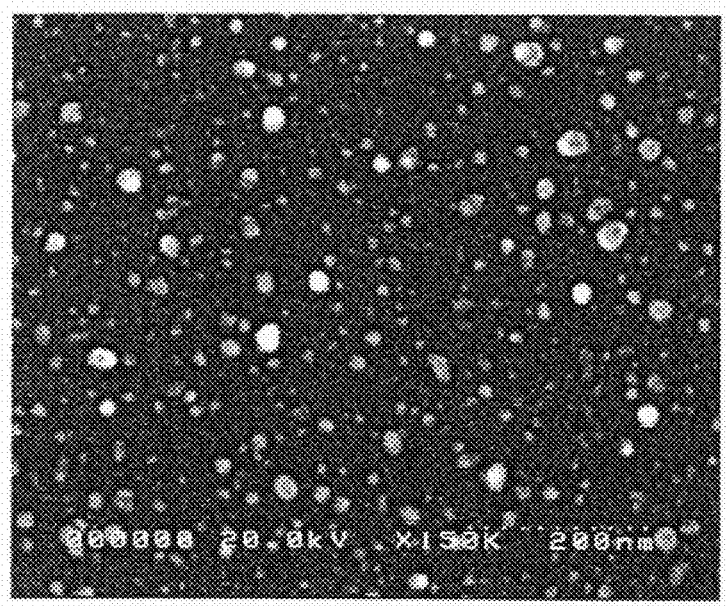

FIG. 4 is a graph showing an estimated value of reset currents of a phase change memory device according to example embodiments and a conventional phase change memory device having a thin film type phase change material layer. Each of the phase change memory devices includes a phase change material layer having a width of 0.5 µm and a thickness of 0.1 µm, a bottom electrode having a width of 50 nm and a top electrode having a width of 0.5 µm. Referring to FIG. 4, the reset current (Ireset) required to change the state of the phase change material layer containing phase change nano particles in the phase change memory device according to example embodiments is smaller than reset currents of the conventional memory device having a thin film type of phase change material layer. The conventional memory device having a thin film type of phase change material layer generally requires a reset current in the range of 0.5 to 2 mA.

Accordingly, a phase change memory device according to example embodiments of the present embodiment may be operated with a lower operating current and/or consume less electric power compared to the conventional phase change memory device having a thin film type phase change material layer. It is also possible to use a small sized switching device with a phase change memory device according to example embodiments of the present embodiment because the operating current is reduced by forming the phase change material layer with phase change nano particles. Therefore, the size of the phase change memory device may be reduced and/or the integrity of the phase change memory device may be increased. Furthermore, characteristics of the phase change material layer 46 may be easily controlled because it is easier to control the formation and size of the nano particles. Therefore, the phase change material layer 46 may be modified to have new characteristics through surface processing of the phase change nano particles.

Hereinafter, a method of fabricating a phase change memory device according to example embodiments will be described with reference to accompanying drawings.

Example 1

Manufacturing of Phase Change Nano Particles

Phase change nano particles of the phase change material layer 46 are manufactured using a laser ablation method under the following conditions. An ArF excimer laser having a wavelength of 193 nm is used. The frequency of a laser pulse is 5 Hz and the width of the pulse is 30 nanoseconds. A $Ge_2Sb_2Te_5$ material is used as a target of laser ablation. The laser ablation is performed under an argon gas atmosphere at 0.1 to 5 Torr and a laser energy density of 2 to 5 J per cm2 is used for manufacturing the phase change nano particles having an average size of 10 to 30 nm.

Phase change nano particles of the phase change material layer 46 may be manufactured using other methods for example CVD, PVD or a chemical route.

Example 2

Physical Property Variation of the Phase Change Particles According to a Thermal Process The phase change particles may be thermal processed in a temperature range of 100 to 650° C., examples of thermal processed phase change materials are shown in FIGS. 5A-5E.

A physical property or a chemical property of the phase change nano particles may be varied according to the temperature of the thermal process and the varied property of the phase change nano particles may influence a property of the phase change material layer 46.

Figure 6A:
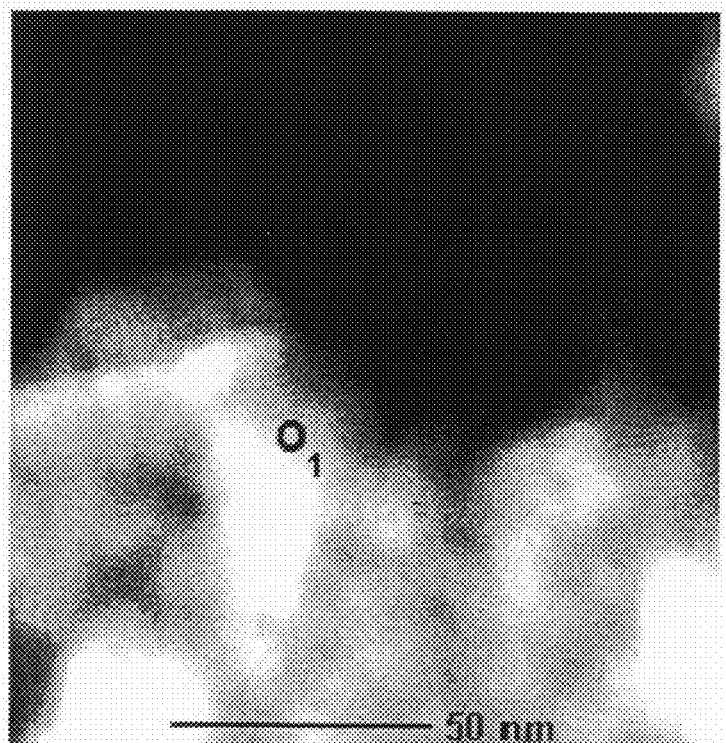
FIG. 6A is a SEM image of $Ge_2Sb_2Te_5$ nano particles used for EDX analysis.
Figure 6B:
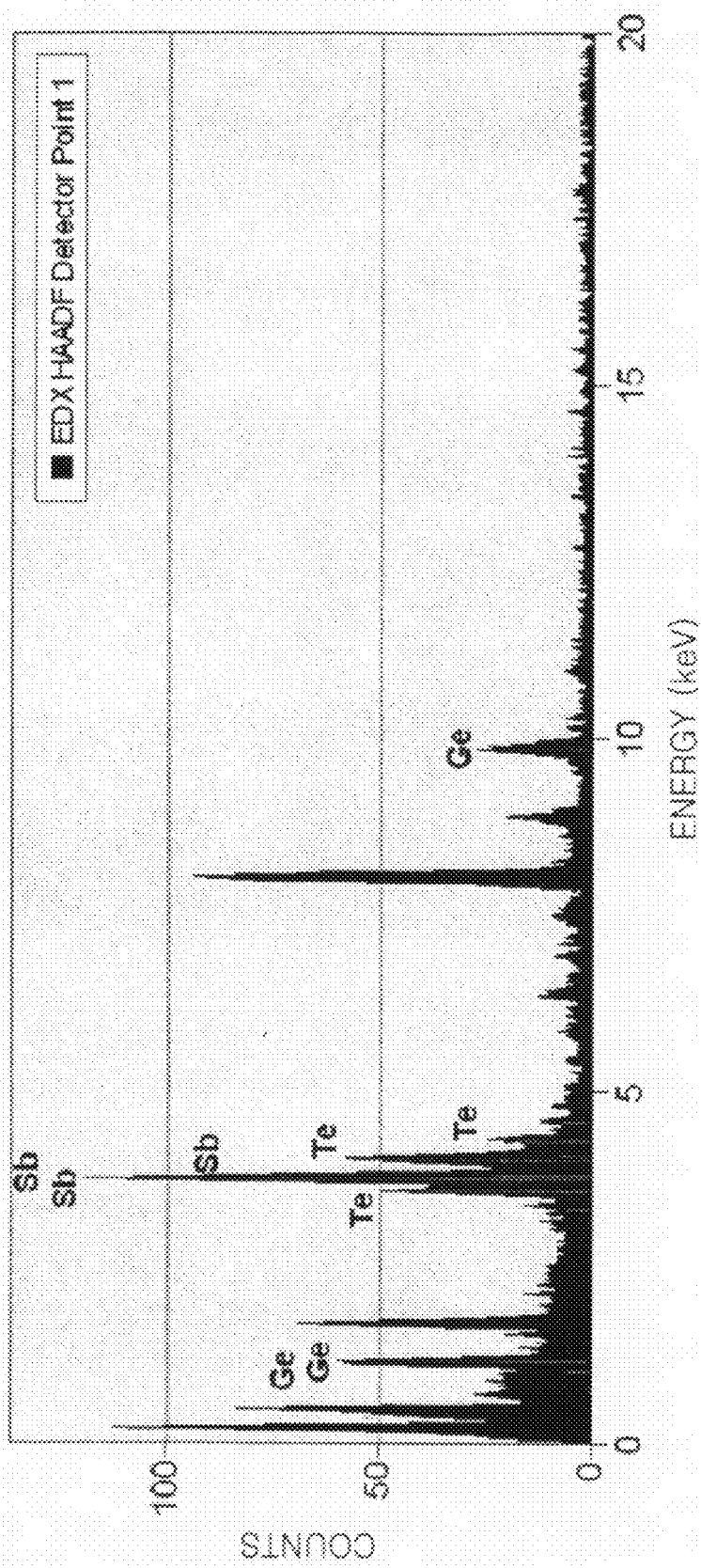
FIG. 6B is a graph showing a result of the EDX analysis of the nano particles.

FIG. 6A is a scanning electron microscope (SEM) image of $Ge_2Sb_2Te_5$ nano particles used for energy dispersive x-ray (EDX) analysis and FIG. 6B is a graph showing a result of EDX analysis of $Ge_2Sb_2Te_5$ nano particles. In the SEM image of FIG. 6A, an area 1 denotes an EDX analysis area.

Figure 7:
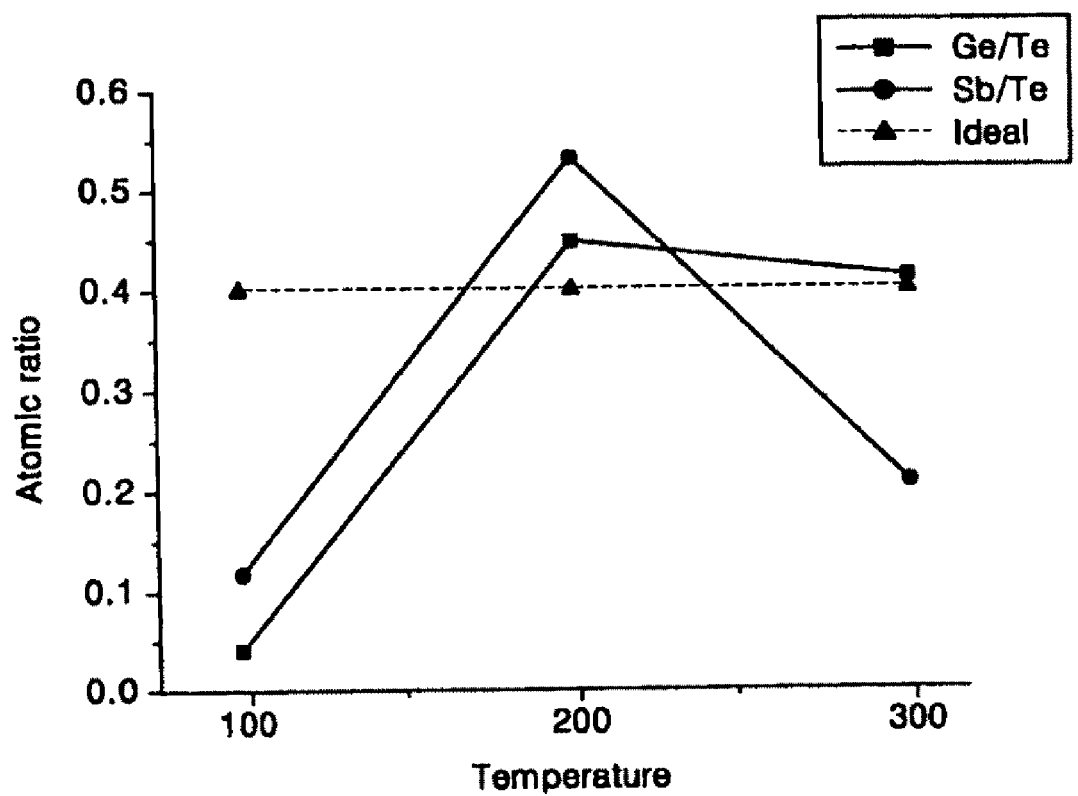

FIG. 7 is a graph of the chemical compound ratio of $Ge_2Sb_2Te_5$ nano particles according to the temperature of a thermal process.

Referring to FIG. 7, the $Ge_2Sb_2Te_5$ nano particles are thermally processed at temperatures of 100, 200, and 300° C. In the graph, a dependence of chemical composition on the temperature of the thermal process is observed. For example, the chemical compound of the nano particles becomes stoichiometric when the nano particles is thermally processed at temperatures higher than 100° C. In particular, the nano particles are most stoichiometric when the nano particles are thermally processed at 200° C. Accordingly, the most stoichiometric and crystalline $Ge_2Sb_2Te_5$ nano particles can be obtained by performing the thermal process at 200° C.

Example 3

Fabrication of Phase Change Memory Device According to Example Embodiments

Figure 8A:
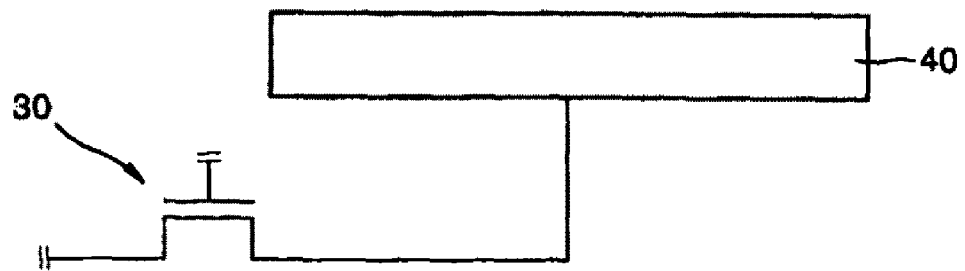
FIGS. 8A-8C are views showing a method of fabricating a phase change memory device according to example embodiments.
Figure 8B:
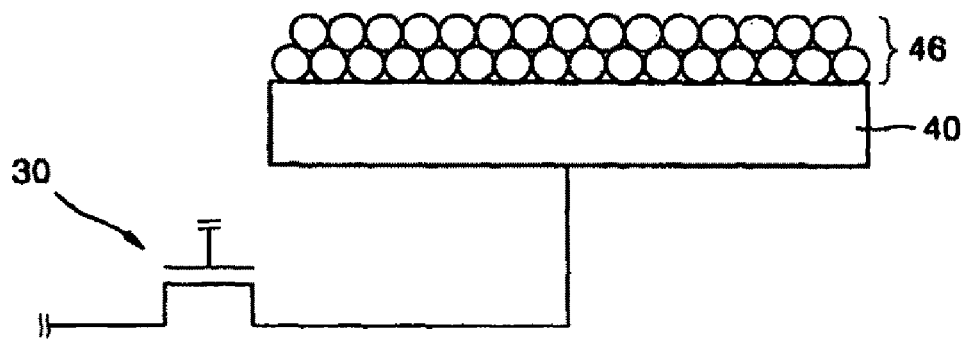
Figure 8C:
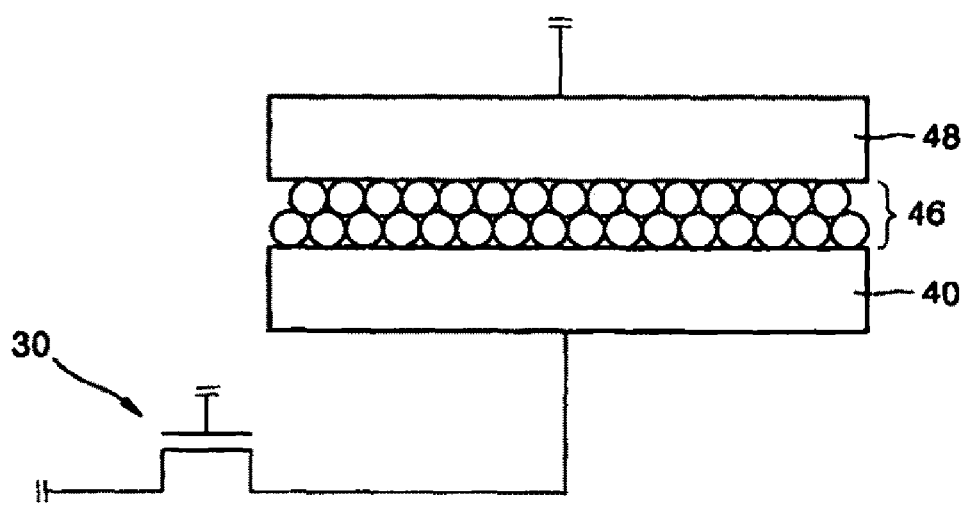

FIGS. 8A-8C are cross-sectional views illustrating a method of fabricating a phase change memory device according to example embodiments. Like reference in FIGS. 8A-8C numerals denote like elements.

Referring to FIG. 8A a transistor 30 may be electrically connected to a first electrode 40. A resistive heater having a small contact size may be further included on the first electrode 40. The configuration of the first electrode 40 in the phase change memory device is well known to those skilled in the art. Accordingly, a detailed explanation thereof is omitted. Referring to FIG. 8B, phase change nano particles may be prepared as described above. After preparing the phase change nano particles, a phase change material layer 46 may be formed by, for example, depositing the phase change nano particles on the first electrode using a thermophoresis method. A thermophoresis method may include maintaining a 200° C. temperature difference between the substrate and a thermophoresis apparatus to deposit the phase change nano particles on the first electrode 40. Referring to FIG. 8C a second electrode 48 may be formed on the phase change material layer 46. The first electrode 40 and the second electrode 48 may be composed of the conductive material. According to the above-described processes, the phase change memory device according to example embodiments is manufactured.

Figure 12A:
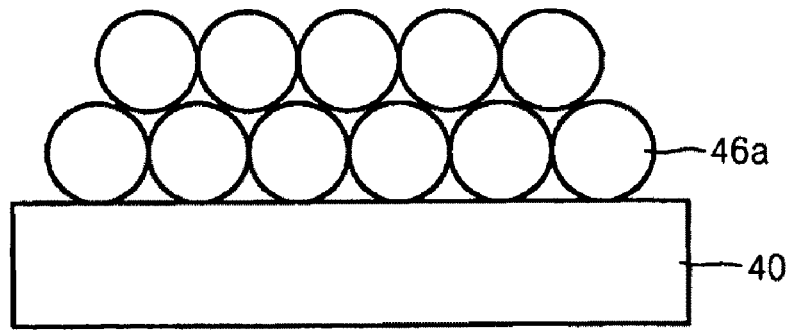
FIGS. 12A-12D are views showing a method of fabricating a phase change memory device according to example embodiments.

FIGS. 12A-12D are views showing a method of fabricating a phase change memory device according to example embodiments. Referring to FIG. 12A, at least one layer of a plurality of phase change nano particles 46a may be formed on a first electrode 40. In example embodiments, the phase change nano particles 46a may contact each other, and pores may exist between the phase change nano particles 46a.

Figure 12B:
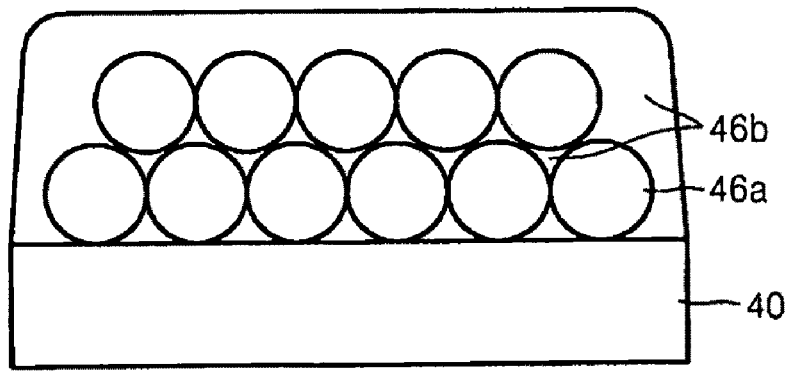
Figure 12C:
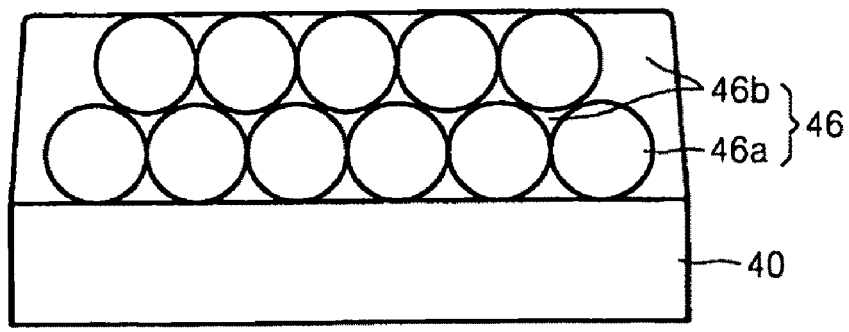

Referring to FIG. 12B, an insulating material 46b may fill the pores between the phase change nano particles 46a formed on the first electrode 40. The insulating material 46b may be formed by using a deposition method (e.g. chemical vapor deposition (CVD) or atomic layer deposition (ALD)). The insulating material 46b may be formed to include the top surface of the phase change nano particles 46a. The insulating material 46b formed on the top surface of the phase change nano particles 46a may be removed by using a removal process (e.g. etch-back process). The result of removing the insulating material 46b on the top surface of the nano particles 46a may be illustrated in FIG. 12C. The phase change nano particles 46a and the insulating material 46b in FIG. 12C may be the phase change material layer 46 in FIG. 3.

Figure 12D:
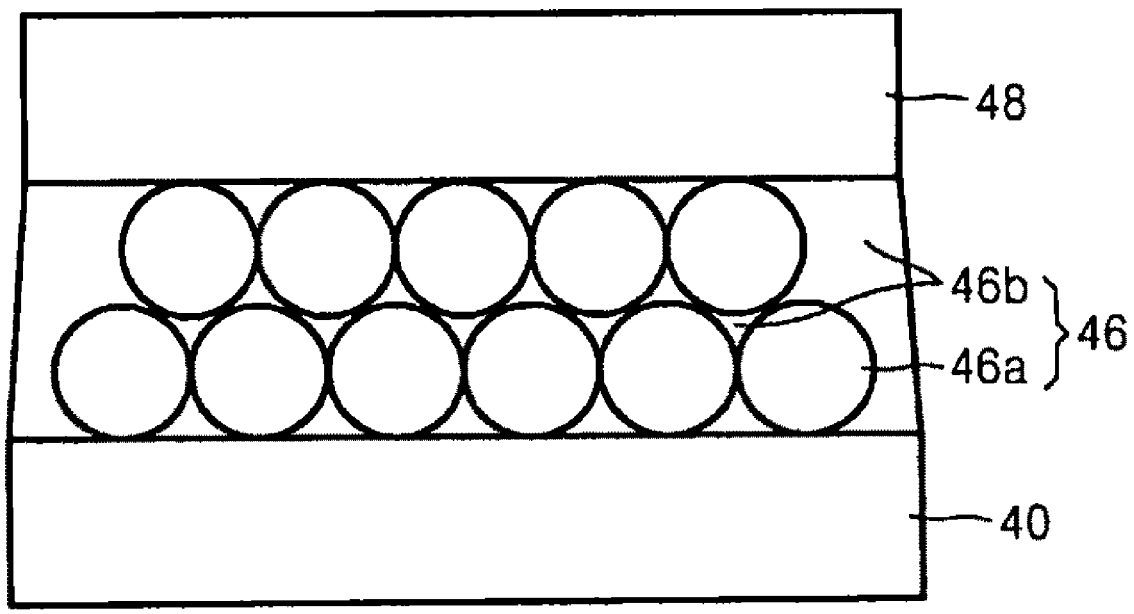

Referring to FIG. 12D, a second electrode 48 contacting the phase change nano particles 46a may be formed on the phase change material layer 46. The phase change nano particles 46a may contact each other, while also contacting the first and second electrodes 40 and 48. Accordingly, the insulating material 46b may not interfere with the electrical connection between the phase change nano particles 46a, and between the phase change nano particles 46a and the first and second electrodes 40 and 48.

Figure 13A:
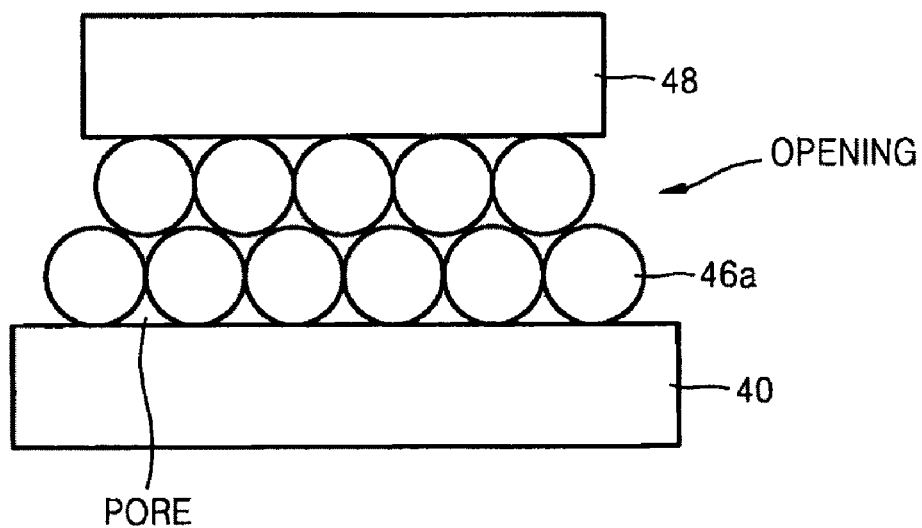
Figure 13B:
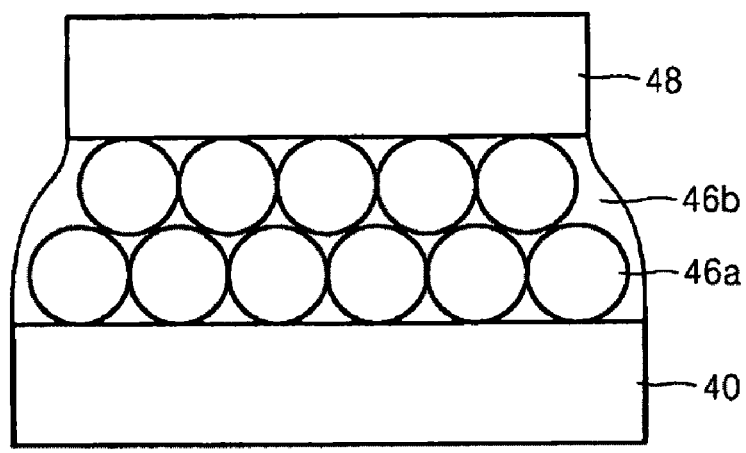

FIGS. 13A-13B are views showing a method of fabricating a phase change memory device according to example embodiments.

Referring to FIGS. 13A-13B, the phase change nano particles 46a may be formed on the first electrode 40, the second electrode 48 may be formed on the plurality of phase change nano particles 46a, and then the insulating material 46b may be formed to fill the pores between the first and second electrodes 40 and 48. Filling pores between phase change nano particles may be performed according to different methods and is not limited by example embodiments. According to example embodiments, the insulating material 46b may be formed by using a deposition method (e.g. chemical vapor deposition (CVD) or atomic layer deposition (ALD)) and the insulating material 46b may fill the pores via openings OPENING between the first and second electrodes 40 and 48.

When a physical vapor deposition (PVD) method is used for forming the second electrode 48, the pores between the phase change nano particles 46a may not be filled with the material of the second electrode 48. Therefore, there may be one or more openings OPENING between the first electrode 40 and the second electrode 48. The pores may be connected to each other even though the nano particles 46a touch each other.

Methods of incorporating an insulating material have been particularly shown and described with reference to example embodiments, including methods of forming a phase change material layer including an insulating material. Example embodiments disclose methods by which pores between nano particles may be filled with an insulating material and conductive contact may be maintained between nano particles and between electrodes. The methods of incorporating an insulating material are not limited to example embodiments and one having skill in the art will recognize that there are many ways in which incorporation of an insulating material may be accomplished. For example, more than one nano particle layer may be assembled, one layer at a time, and by incorporating insulation material one layer at a time.

Figure 9:
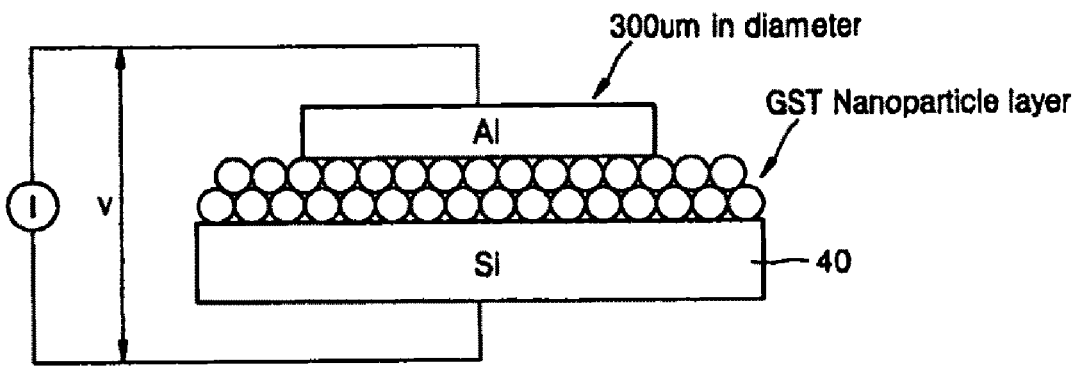

FIG. 9 is a schematic cross sectional view of a phase change memory device according to example embodiments for observing current-voltage (I-V) characteristics.

First, phase change nano particles having an average size of 10 nm were fabricated according to the laser ablation method described above using a laser energy density of 2.5 J/cm2 under a pressure of 2 Torr. The fabricated phase change nano particles were thermally processed at 200° C. A phase change memory device was then formed according to example embodiments as described above. That is, $Ge_2Sb_2Te_5$ nano particles were deposited on a Si substrate to have a thickness of 50 nm and an Al electrode having a diameter of 300 μm was formed on the nano particles. The I-V characteristics according to a phase change were observed while a current flowed between the Al electrode and the Si substrate.

Figure 10:
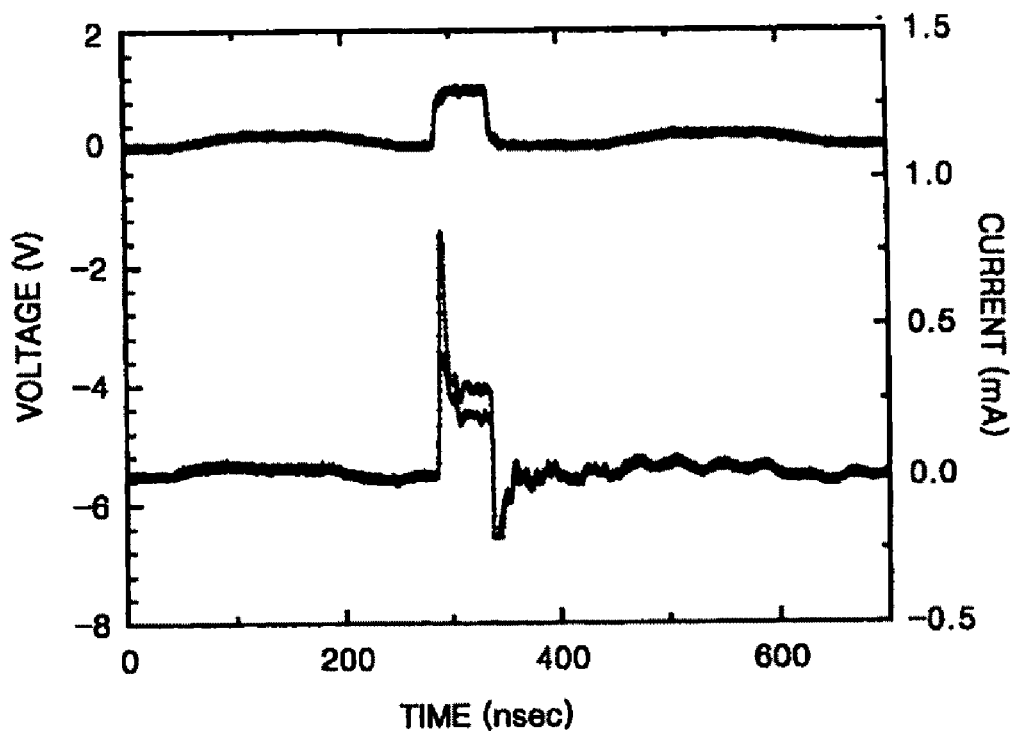

FIG. 10 is a graph showing voltage and current pulses used for resetting the phase change memory device shown in FIG. 9. The term "reset" means a state transition of a phase change material from a crystalline state (low resistance) to an amorphous state (high resistance). FIG. 10 shows the current observed when 1 V is applied for 50 ns. Referring to FIG. 10, the average amplitude of the current was 0.3 mA and maximum amplitude of the current was 0.8 mA. Therefore, a wider area of the electrode can be reset using a lower current in the phase change memory device according to example embodiments compared to the conventional art. FIG. 4 shows the expected reset current calculated from the data shown in FIG. 10. 0.5 to 1.5 mA is generally required for resetting a 64M PRAM having conventional bottom electrode with a diameter of 50 nm.

Figure 11:
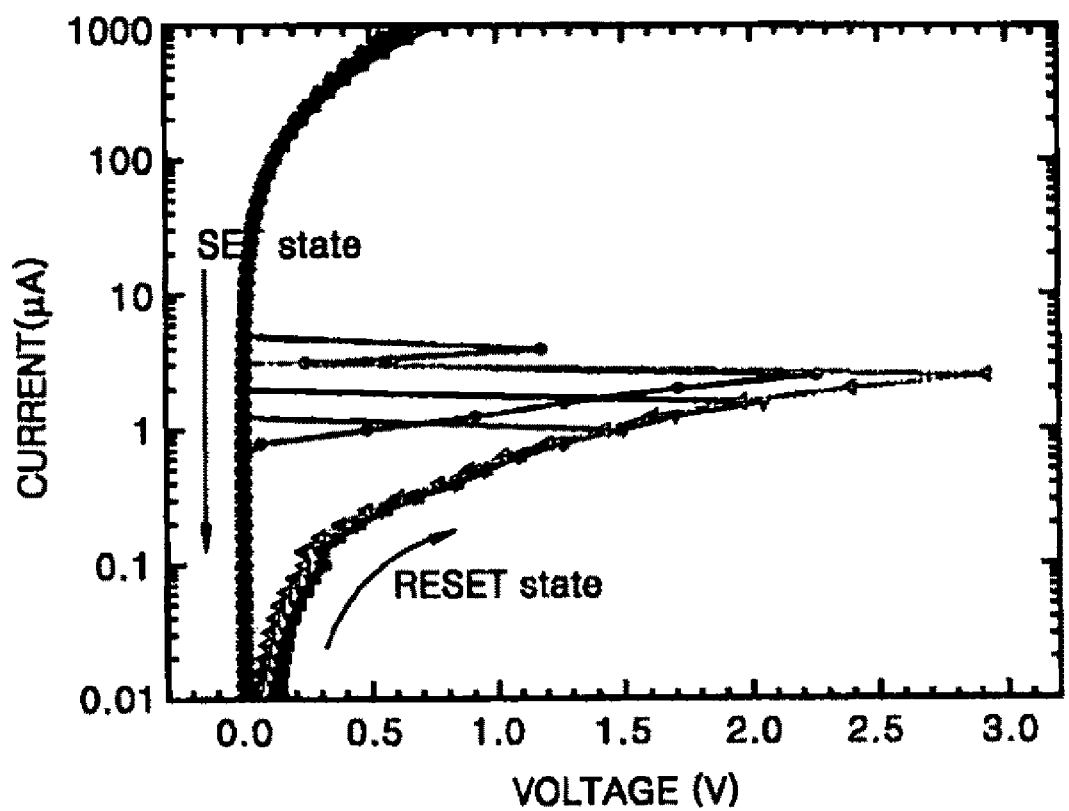

FIG. 11 is a graph of the current-voltage (I-V) characteristics of the phase change memory device shown in FIG. 9. If the phase change memory device shown in FIG. 9 is reset by supplying the pulses shown in FIG. 10, the phase change material layer enters high resistance state. This is illustrated as a RESET state in the graph of FIG. 11. If the current flowing through the phase change memory layer is gradually increased in the high resistance state, the temperature of the phase change memory layer increases, and thus the state of the phase change material layer is changed from an amorphous state to a crystalline state. If the current flowing the phase change memory layer is reduced in the SET state, the phase change material layer enters a low resistance state. This is illustrated as SET state in the graph of FIG. 11. If a reset pulse is supplied after reducing the current to 0, the state of the phase change material layer is changed from the crystalline state to the amorphous state. While repeatedly changing the state of the phase change memory device, the I-V characteristics were observed. The graph shows that RESET-SETs are repeatedly and stably performed.

According to example embodiments, a phase change memory device having a phase change material layer containing phase change nano particles between two electrodes and a method of fabricating the same are provided. A reset current Ireset required for the phase change material layer to change its state from a crystalline state to an amorphous state is lower than that for a thin film phase change material layer of a conventional phase change memory device. Thus, operating current and/or power consumption of the phase change memory device according to example embodiments may be greatly reduced compared with the conventional phase change memory device.

Further, it may be easier to control the size and/or formation of phase change nano particles, the characteristics of the phase change material can also be easily controlled and different characteristics of a phase change material layer can be obtained by surface treatment of the phase change nano particles.

By using phase change nano particles to form the phase material layer of the phase change memory, the phase change memory can be operated with a comparatively less operating current, and thus it is possible to use a smaller sized switching device. Therefore, higher integrity and/or improved reproducibility of the phase change memory device may be obtained.

The phase change memory device according to example embodiments and the method of fabricating the same may be implemented to manufacture a next generation semiconductor memory device.

While example embodiments have been particularly shown and described, it will be understood by those of ordinary skill in the art that various changes in form and details may be made therein without departing from the spirit and scope of the present invention as defined by the following claims.

What is claimed is:

1. A phase change memory device comprising:
    a first electrode and a second electrode facing each other;
    a phase change material layer containing phase change nano particles interposed between the first electrode and the second electrode; and
    a switching device electrically connected to the first electrode,
    wherein a plurality of the phase change nano particles contact each other,
    pores exist between the plurality of phase change nano particles, the pores including at least a first pore further defined by the first electrode and a second pore further defined by the second electrode,
    the pores are filled with an insulating material, and
    the insulating material is in contact with both of the first and second electrodes.

2. The phase change memory device of claim 1, wherein the switching device is one of a transistor and a diode.

3. The phase change memory device of claim 1, wherein the phase change nano particles are derived from a compound including at least one selected from the group consisting of S, Se, Te, As, Sb, Ge, Sn, In, and Ag.

4. The phase change memory device of claim 1, wherein a diameter of the phase change nano particles is in a range from 1 to 100 nm.

5. The phase change memory device of claim 1, wherein the insulating material is at least one of $SiO_2$ and $Si_3N_4$.

6. The phase change memory device of claim 1, wherein the phase change nano particles of the phase change material layer are doped with a doping material.

7. The phase change memory device of claim 6, wherein the doping material is at least one of nitrogen and silicon.

8. The phase change memory device of claim 1, wherein adjacent phase change nano particles of the phase change nano particles contact each other.

* * * * *